United States Patent
Momokawa (10) Patent No.: US 10,307,868 B2
(45) Date of Patent: Jun. 4, 2019

(54) SOLDER ALLOY

(71) Applicant: NEC Corporation, Minato-ku, Tokyo (JP)

(72) Inventor: Yuuki Momokawa, Tokyo (JP)

(73) Assignee: NEC CORPORATION, Tokyo (JP)

(*) Notice: Subject to any disclaimer, the term of this patent is extended or adjusted under 35 U.S.C. 154(b) by 0 days.

(21) Appl. No.: 15/569,106

(22) PCT Filed: Apr. 25, 2016

(86) PCT No.: PCT/JP2016/002170
§ 371 (c)(1),
(2) Date: Oct. 25, 2017

(87) PCT Pub. No.: WO2016/185673
PCT Pub. Date: Nov. 24, 2016

(65) Prior Publication Data
US 2018/0117715 A1    May 3, 2018

(30) Foreign Application Priority Data
May 20, 2015 (JP) ................. 2015-102915

(51) Int. Cl.
C22C 13/00    (2006.01)
C22C 1/04    (2006.01)
B23K 35/26    (2006.01)
B23K 35/22    (2006.01)
H05K 1/18    (2006.01)
H05K 3/34    (2006.01)
(Continued)

(52) U.S. Cl.
CPC .......... *B23K 35/262* (2013.01); *B23K 35/025* (2013.01); *B23K 35/0244* (2013.01); *B23K 35/26* (2013.01); *C22C 1/0483* (2013.01); *C22C 13/00* (2013.01); *H05K 1/181* (2013.01); *H05K 3/3463* (2013.01); *B23K 2101/36* (2018.08); *H05K 3/3436* (2013.01); *H05K 2201/10734* (2013.01)

(58) Field of Classification Search
None
See application file for complete search history.

(56) References Cited

U.S. PATENT DOCUMENTS 5,405,577 A    4/1995  Seelig et al.
5,527,628 A    6/1996  Anderson et al.
(Continued)

FOREIGN PATENT DOCUMENTS

JP    2752258 B2    5/1998
JP    2004-261863 A    9/2004
(Continued)

OTHER PUBLICATIONS

International Search Report for PCT Application No. PCT/JP2016/002170, dated Jul. 26, 2016.
(Continued)

*Primary Examiner* — Deborah Yee (57) ABSTRACT

In order to improve the strength and elongation of a solder and improve the reliability of a joining portion joined by the solder, the present invention provides a solder alloy that comprises 2.0 to 4.0 mass % of Ag, 0.5 to 1.0 mass % of Cu, 0.1 to 0.5 mass % of an additive element selected from the group consisting of Ca and Mn, and a balance of Sn.

10 Claims, 5 Drawing Sheets

(51) Int. Cl.
 *B23K 35/02* (2006.01)
 *B23K 101/36* (2006.01)

(56) References Cited

U.S. PATENT DOCUMENTS

| | | |
|---|---|---|
| 2004/0262779 A1 | 12/2004 | Amagai et al. |
| 2005/0100474 A1* | 5/2005 | Huang ................. B23K 35/262 420/560 |
| 2007/0295528 A1 | 12/2007 | Nishi et al. |
| 2008/0159904 A1* | 7/2008 | Lewis ..................... C22C 13/00 420/561 |
| 2010/0203353 A1 | 8/2010 | Anderson et al. |
| 2012/0038042 A1 | 2/2012 | Sasaki et al. |
| 2012/0328361 A1* | 12/2012 | Liu ......................... C22C 13/00 403/272 |
| 2013/0098506 A1 | 4/2013 | Toyota et al. |
| 2014/0219711 A1* | 8/2014 | Pandher ............... B23K 35/262 403/272 |
| 2015/0224604 A1* | 8/2015 | Choudhury .......... B23K 1/0016 403/272 |

FOREIGN PATENT DOCUMENTS

| | | |
|---|---|---|
| JP | 2008-031550 A | 2/2008 |
| JP | 2010-247167 A | 11/2010 |
| JP | 5553181 B2 | 7/2014 |
| JP | 2014-160822 A | 9/2014 |

OTHER PUBLICATIONS

English translation of Written opinion for PCT Application No. PCT/JP2016/002170.

Anderson, et al., "Suppression of Void Coalescence in Thermal Aging of Tin-Silver-Copper-X Solder Joints", Journal of Electronic Materials, 2006, pp. 94-106, vol. 35, No. 1 (13 pages total).

\* cited by examiner

SOLDER ALLOY

This application is a National Stage Entry of PCT/JP2016/002170 filed on Apr. 25, 2016, which claims priority from Japanese Patent Application 2015-102915 filed on May 20, 2015, the contents of all of which are incorporated herein by reference, in their entirety.

TECHNICAL FIELD

This invention relates to a solder alloy for soldering.

BACKGROUND ART

As a Sn-based lead-free solder, a Sn—Ag—Cu based solder, for example, Sn-3.0Ag-0.5Cu, is widely used. In recent years, as a price of Ag rises, a price of the solder containing Ag also rises. Therefore, a solder alloy having a low Ag content, like Sn-1.0Ag-0.7Cu or Sn-0.3Ag-0.7Cu, attracts attention.

If the Ag content in a solder alloy is decreased, a melting point of the solder alloy is increased. In the solder alloy having the low Ag content, it is feared that the strength and reliability of the solder is deteriorated because an amount of an intermetallic compound which is deposited on a joining interface is decreased.

In order to reduce the melting point of the Sn—Ag—Cu based solder and improve the strength and reliability of the solder, it is effective to add Bi thereto. In the field of onboard equipment where a solder with high strength is required, by adding Bi to a Sn based solder containing about 3 math % (hereinafter, refer to as "wt %") to 5 wt % of Ag to make Bi dissolved into Sn, the mechanical strength of the solder is improved.

However, if Bi is added to the Sn—Ag—Cu based solder, fragile Bi is deposited on an interface between an electrode and the solder, and fatigue lifetime of the joining portion between the electrode and the solder may be shortened. Therefore it is appropriate that a Bi-free solder is used in products in which high reliability and long lifetime are required.

PTLs 1 to 3 disclose a solder paste containing a Bi-free solder alloy powder.

PTL 1 discloses the solder alloy powder containing 1.0 to 4.0 wt % of Ag, 0.4 to 1.0 wt % of Cu, 1 to 8 wt % of Sb, and a balance of Sn. PTL 1 also discloses the solder alloy of the Ag—Cu—Sb—Sn based alloy containing 0.4 wt % or less of at least one element selected from Ni, Co, and Fe.

PTL 2 discloses the solder alloy containing 0.5 to 3.5 wt % of Ag, 0.1 to 2.8 wt % of Cu, 0.2 to 2.0 wt % of Sn, and a balance of Sn.

PTL 3 discloses the solder alloy containing 0.1 to 5 wt % of Ag, 0.1 to 5 wt % of Cu, 10 wt % or less of a transformation delaying element, 10 wt % or less of an oxidation inhibiting element, and a balance of Sn. PTL 3 discloses the example which describes a whisker resistance property is improved by adding combination of 0.01 to 1 wt % of the transformation delaying element and 0.01 wt % of the oxidation inhibiting element to the Sn based solder alloy.

CITATION LIST

Patent Literature

[PTL 1] Japanese Patent No. 5553181
[PTL 2] Japanese Patent No. 2752258
[PTL 3] Japanese Patent Laid-Open Application Publication No. 2008-31550

SUMMARY OF INVENTION

Technical Problem

In the Sn—Ag—Cu based solder, the melting point of the solder generally rises if the content of Ag is reduced. Adding Bi to the Sn—Ag—Cu based solder effectively reduces the melting point of the solder. However fragile Bi is deposited on the joining interface between an electrode and the solder.

Since the composition of the Sn—Ag—Cu based solder disclosed in PTLs 1 and 2 does not contain Bi, the fragile metal Bi is not deposited on the interface between an electrode and the solder. PTL 1 however does not disclose composition which improves mechanical characteristics and reliability of the solder. In PTL 2, since Sb is added to the solder, the elongation of the solder is deteriorated.

Describing many additive elements, PTL 3 does not disclose an optimum alloy composition for the mechanical characteristics and reliability except the whisker resistance property. Further PTL 3 does not suggest an additive element and the amount thereof which improve the mechanical characteristics and reliability of the solder except the whisker resistance property.

An object of the invention is to solve the above mentioned problem, and provide a solder alloy which improves strength and elongation of a solder and improves reliability of a joining portion which is formed by using the solder.

Solution to Problem

A solder alloy of the invention contains 2.0 to 4.0 mass % (hereinafter, wt %) of Ag, 0.5 to 1.0 wt % of Cu, 0.1 to 0.5 wt % of an additive element selected from the group consisting of Ca and Mn, and a balance of Sn.

Advantageous Effects of Invention

The solder alloy of the invention contains 2.0 to 4.0 wt % of Ag, 0.5 to 1.0 wt % of Cu, 0.1 to 1.0 wt % of Sb, 0.1 to 0.5 wt % of an additive element selected from the group consisting of Ca, Mn, and Al, and a balance of Sn.

DESCRIPTION OF EMBODIMENTS

An example embodiment in which the invention is carried out is described by using drawings. The example embodiment described below includes technically preferable limitations for carrying out the invention. However the scope of the invention is not limited to following descriptions. (Structure)

The solder alloy of the example embodiment is explained below. In the example embodiment, a composition which improves characteristics of a Sn—Ag—Cu based solder alloy which contains Sn as a main component, and Ag and Cu as additive elements is disclosed.

In the Sn—Ag—Cu based solder alloy, an intermetallic compound containing Cu and Sn, or Ni and Sn joins the solder and a substrate or a component electrode on their joining interface. In order to decrease the melting point of the Sn—Ag—Cu based solder alloy, Bi may be added thereto. If Bi segregation occurs between the intermetallic compound containing Cu and Sn, or Ni and Sn which is deposited on the joining interface and the solder, joining reliability of the Bi segregation area may be deteriorated. The solder alloy of the example embodiment prolongs lifetime of the solder joining portion, by adding elements except Bi to the Sn—Ag—Cu based solder alloy.

In this embodiment, an element improving elongation of a solder is added to the solder alloy. In this example embodiment, at least one of Ca and Mn is added to the solder alloy as the element improving the elongation of the solder.

Two elements, Ca, Mn have eutectic points with Sn each other. Since the eutectic points of each of Ca and Mn, and Sn are high, any low-melting phase is not generated at around a melting temperature of a common Sn based solder. Therefore addition of the elements improves the strength and elongation of the solder, and prevent additive element segregation near the interface. Consequently the solder alloy of the example embodiment has a long lifetime compared with a common solder alloy which may generate a crack which starts from additive element segregation.

When each of Ca and Mn is added to Sn, which is a main component, the solder elongation is improved and following characteristics improving effects are obtained.

Ca suppresses growth of Sn or an intermetallic compound like CuSn, AgSn. Mn shortens wetting time.

Solid solubility limit of Ca is about 0.34 wt %. Solid solubility limits of Mn is about 0.46 wt %. An upper limit of an amount of the elements which is added to Sn is desirably a value close to the solid solubility limit, and more desirably a value equal to or less than the solid solubility limit. The value close to the solid solubility limit is a value which exceeds the solid solubility limit and in which the additive elements are not redeposited. Specifically the value is 0.5 wt % or less.

From the viewpoint of the above descriptions, suitable composition for long lifetime of a solder are described below. The solder with the composition described below is introduced from the point of view of above descriptions, and two or more materials are not combined baselessly. Ca, Mn, and Al may be coexisted.

When Ca is added, the solder which contains 2.0 to 4.0 wt % of Ag, 0.5 to 1.0 wt % of Cu, 0.1 to 0.5 wt % of Ca and a balance of Sn has a long lifetime. A more suitable composition contains 2.0 to 4.0 wt % of Ag, 0.5 to 1.0 wt % of Cu, 0.1 to 0.33 wt % of Ca and a balance of Sn.

When Mn is added, the solder which contains 2.0 to 4.0 wt % of Ag, 0.5 to 1.0 wt % of Cu, 0.1 to 0.5 wt % of Mn, and a balance of Sn has a long lifetime. A more suitable composition contains 2.0 to 4.0 wt % of Ag, 0.5 to 1.0 wt % of Cu, 0.1 to 0.45 wt % of Mn, and a balance of Sn.

Ca and Mn may be coexisted. A composition which contains 2.0 to 4.0 wt % of Ag, 0.5 to 1.0 wt % of Cu, 0.1 to 0.5 wt % of Ca, 0.1 to 0.5 wt % of Mn and a balance of Sn is suitable. A more suitable composition contains 2.0 to 4.0 wt % of Ag, 0.5 to 1.0 wt % of Cu, 0.1 to 0.33 wt % of Ca, 0.1 to 0.45 wt % of Mn and a balance of Sn.

Generally, an additive element which is added so as to exceed the solid solubility limit, is excessively dissolved thereinto due to supercooling just after soldering. However, when heat or strain is applied to the solder into which the additive element excessively dissolves, a part of the additive element cannot remain dissolved and is redeposited.

Generally, when an intermetallic compound grows on a joining interface due to heat load, Sn is consumed at the surrounding area where the intermetallic compound grows. Therefore, on the joining interface where the intermetallic compound grows, concentration of an additive element is relatively increased and a part of the additive element which exceeds the solid solubility limit is redeposited. If the additive element is redeposited on the joining interface, mechanical characteristics of the solder is extremely affected. Particularly if the additive element is deposited to form a layer structure, the deposited additive element layer may become a starting point of a crack or a crack growing path.

In the solder of the example embodiment, there is low probability that the additive element is redeposited because the additive element of the addition amount which close to the solid solubility limit is dissolved not so as to be excessive. If the addition amount of the additive element is the solid solubility limit or under, there is further low probability that the additive element is redeposited.

In the solder alloy of the example embodiment, even if heat load or mechanical strain is repeatedly applied to the solder joining portion, a crack is hard to occur on the joining interface. Therefore deterioration of reliability due to a crack can be suppressed.

Figure 1:
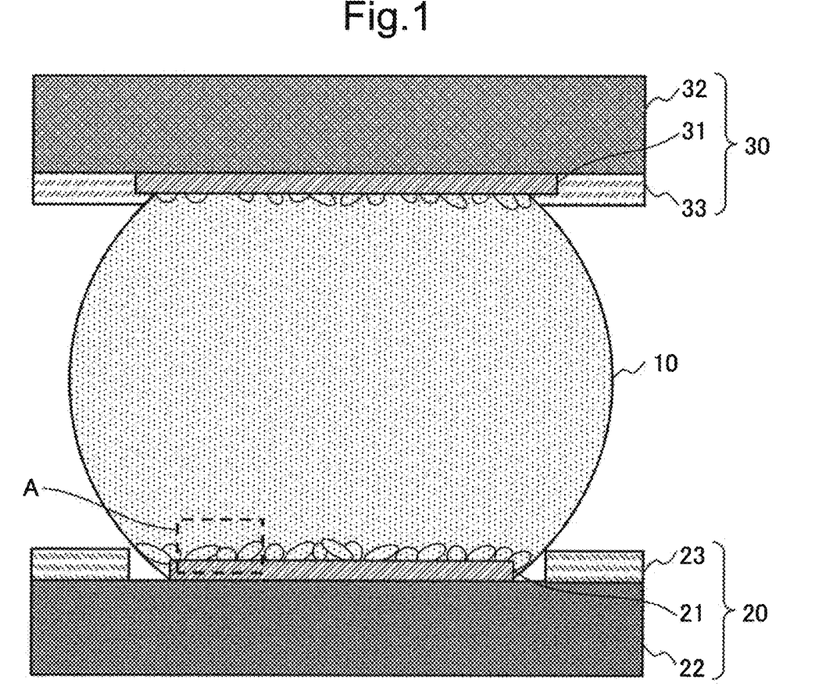
FIG. 1 a schematic diagram illustrating a cross-sectional structure of a joining portion formed by using a solder of an example embodiment of the invention.
Figure 2:
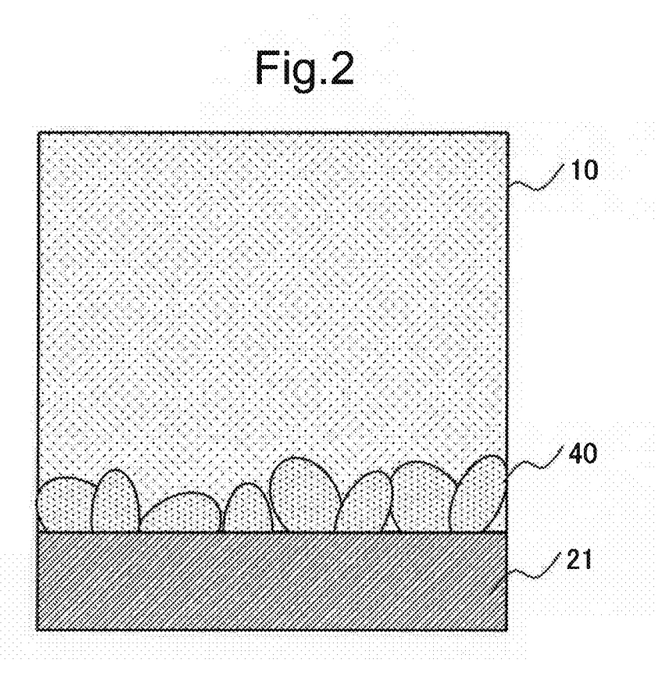
FIG. 2 a schematic diagram illustrating a detailed cross-sectional structure of the joining portion formed by using the solder of the example embodiment of the invention.

FIG. 1 is a schematic diagram illustrating an example in which a solder 10 containing the solder alloy of the example embodiment joins a substrate electrode 21 to a component electrode 31. FIG. 2 is a schematic diagram in which a rectangle A in FIG. 1 (inside of dashed lines) is enlarged.

In FIG. 1, the substrate electrode 21 is mounted on a base material 22 in a substrate 20. A resist 23 is arranged around the substrate electrode 21. The component electrode 31 is mounted on a base material 32 of an electronic component 30. A solder mask 33 is arranged around the component electrode 31.

As illustrated in FIG. 2, a compound phase 40 is deposited in a joining portion between the substrate electrode 21 and the solder 10. The compound phase 40 is formed from an intermetallic compound containing CuSn or NiSn. Thereby the substrate electrode 21 is joined to the solder 10. In the solder alloy of the example embodiment, since the additive element is not deposited between the compound phase 40 and the solder 10 and is diffused into the solder, long lifetime of the joining portion is achieved. The situation of the joining interface between the substrate electrode 21 and the solder 10 is same as that of a joining portion between the component electrode 31 and the solder 10.

(Deposition of Bi)

In a solder joining portion employing a solder in which the solder alloy contains Sn, as a main component, and Bi, as an additive element, a mechanism in which Bi is deposited to form a layer structure on the joining interface and the layer becomes a starting point of a crack is explained.

Figure 3:
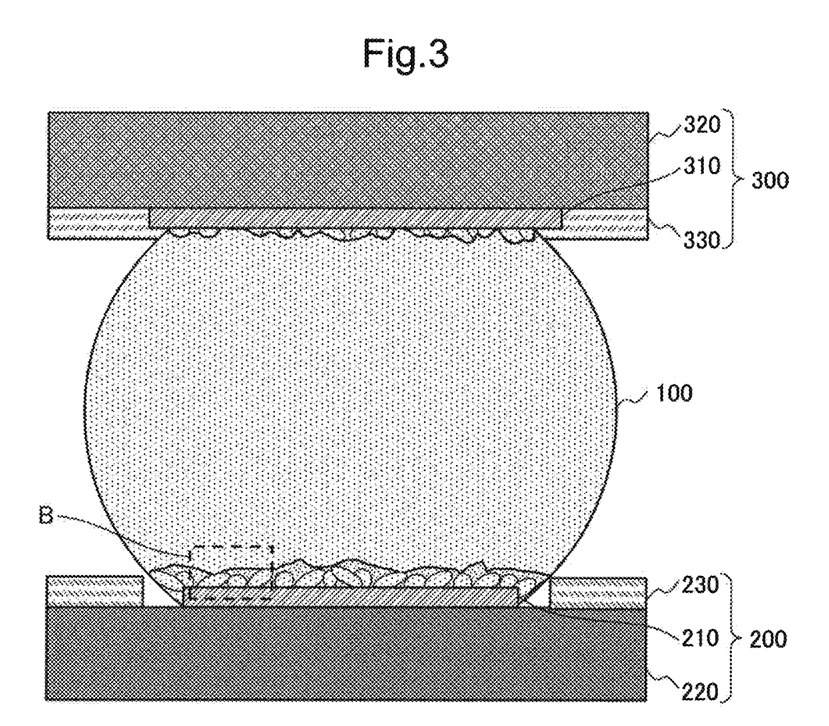
FIG. 3 a schematic diagram illustrating a cross-sectional structure of the joining portion formed by using a common solder containing Bi.
Figure 4:
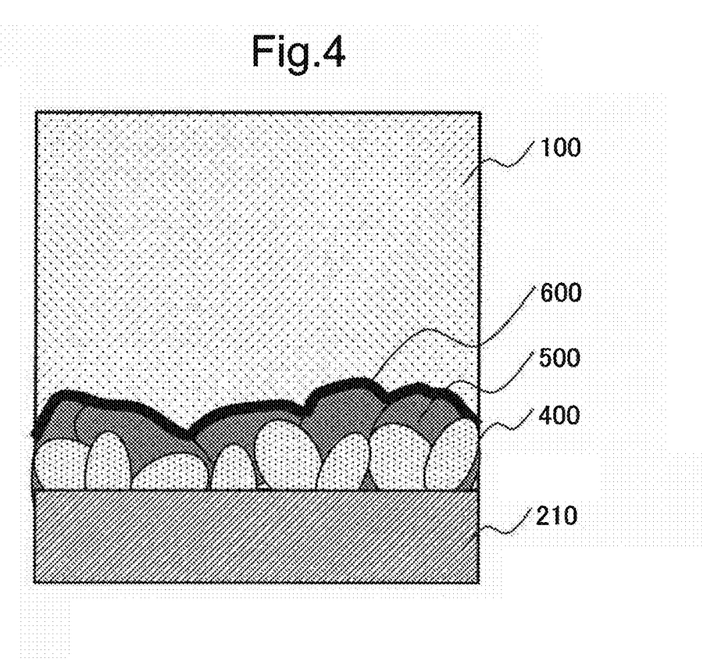
FIG. 4 a schematic diagram illustrating a detailed cross-sectional structure of a joining portion joined by using a common solder containing Bi.

FIG. 3 is a schematic diagram illustrating an example in which a substrate electrode 210 is joined to a component electrode 310 by a solder 100 containing Bi. FIG. 4 is a schematic diagram in which a rectangle B (inside of dashed lines) in FIG. 3 is enlarged.

As illustrated in FIG. 3, the substrate electrode 210 is mounted on a base material 220 in a substrate 200. A resist 230 is arranged around the substrate electrode 210. A component electrode 310 is mounted on a base material 320 in an electronic component 300. A solder mask 330 is arranged around the component electrode 310.

As illustrated in FIG. 4, a compound phase 400 is deposited in a joining portion between the substrate electrode 210 and the solder 100. The compound phase 400 is an intermetallic compound containing CuSn or NiSn. Thereby the substrate electrode 210 is joined to the solder 100. Bi 400 is deposited to form a layer structure between the solder 100 containing Bi and the compound phase 400. A crack 600 is generated between the layered Bi 400 and the solder 100. In the solder 100, a fragile Bi 500 is deposited in a joining portion between the substrate electrode 210 and the solder 100. Since Bi is hard to be deformed at a normal temperature, a crack 600 is easily generated inside a crystal of the Bi 500 and on a crystal interface thereof if the Bi 500 is deposited in the joining portion between the substrate electrode 210 and the solder 100.

There is probability that the crack 600 is generated in the Bi 500 itself or the neighboring area thereof due to applied strain and reliability of the joining portion is deteriorated. The situation of the joining interface between the substrate electrode 210 and the solder 100 illustrated in FIG. 4 is the same as that of a joining interface between the component electrode 310 and the solder 100.

Bi has a eutectic point (139° C.) with Sn. Therefore when a melted solder is solidified, Bi segregation occurs in a part where temperature is high and solidification speed is low (near the joining interface) due to temperature gradient, and Bi concentration near the joining interface rises. If the compound phase (400 in FIG. 4) containing Cu or Ni, and Sn on the joining interface grows due to heat load, etc. Sn near the compound phase is consumed and concentration of Bi near the compound phase further rises. Consequently Bi (500 in FIG. 4) which dissolves in Sn (100 in FIG. 4) is redeposited to form a layer structure on the joining interface, in a part where concentration of Bi exceeds the solid solubility limit.

Since the Bi crystal is fragile and hard to be deformed, the Bi crystal becomes a starting point of a crack (600 in FIG. 4) when stress is applied thereto.

In order to prevent Bi segregation above mentioned, it is required to homogeneously diffuse Bi in a solder. In order to achieve high reliability of a solder containing Bi, it is needed to make temperature of the solder joining portion homogeneous from the beginning of dissolution to solidification and not to form temperature gradient in the solder joining portion, during soldering. It is difficult to carry out such soldering work. Generally, when Bi is homogeneously diffused in a solder to form solid-solution strengthening, elongation of the solder is reduced though strength thereof is increased. If elongation of the solder is reduced though strength thereof is increased, toughness is deteriorated and lifetime may be decreased.

Examples on a solder of the example embodiment are explained below. A solder paste, a structure of a solder joining portion, a device, and a method for making solder powder and a solder ball are explained as examples. A material, a device, a product, etc. which the solder of the example embodiment is applied to is included in the scope of the invention.

First Example

A solder powder of an example 1 is used for joining a component electrode and a substrate electrode by a solder. A method for making the solder powder of the example is described below.

The solder powder of the example has solder composition disclosed in the example embodiment. An additive element is diffused in Sn which is a main element of the solder, or contained in a compound phase deposited in a joining interface or the solder.

A composition having Ca as an additive element contains 2.0 to 4.0 wt % of Ag, 0.5 to 1.0 wt % of Cu, 0.1 to 0.5 wt % of Ca and a balance of Sn. A more suitable composition contains 2.0 to 4.0 wt % of Ag, 0.5 to 1.0 wt % of Cu, 0.1 to 0.33 wt % of Ca and a balance of Sn.

A composition having Mn as an additive element contains 2.0 to 4.0 wt % of Ag, 0.5 to 1.0 wt % of Cu, 0.1 to 0.5 wt % of Mn and a balance of Sn. A more suitable composition contains 2.0 to 4.0 wt % of Ag, 0.5 to 1.0 wt % of Cu, 0.1 to 0.45 wt % of Mn and a balance of Sn.

If soldering is carried out by using the solder powder of the example, the strength and elongation of the joining portion is improved due to addition of Ca or Mn. As a result, additive element segregation near the interface which is generated when Bi is added and generation of cracks due to the segregation are suppressed.

Second Example

A solder ball of an example 2 is mainly mounted on a component electrode of an electronic component and is used for joining the component electrode to a substrate electrode. A method for making the solder ball of the example is described below.

A solder powder applied to the solder ball of the example has the composition disclosed in the example embodiment. An additive element is diffused in Sn which is a main element of the solder, or contained in the compound phase deposited in the joining interface.

A composition having Ca as an additive element contains 2.0 to 4.0 wt % of Ag, 0.5 to 1.0 wt % of Cu, 0.1 to 0.5 wt % of Ca and a balance of Sn. A more suitable composition contains 2.0 to 4.0 wt % of Ag, 0.5 to 1.0 wt % of Cu, 0.1 to 0.33 wt % of Ca and a balance of Sn.

A composition having Mn as an additive element contains 2.0 to 4.0 wt % of Ag, 0.5 to 1.0 wt % of Cu, 0.1 to 0.5 wt % of Mn and a balance of Sn. A more suitable composition contains 2.0 to 4.0 wt % of Ag, 0.5 to 1.0 wt % of Cu, 0.1 to 0.45 wt % of Mn and a balance of Sn.

If the solder ball of the example is used, the strength and elongation of the joining portion is improved due to addition of Ca or Mn. As a result, additive element segregation near the interface which is generated when Bi is added and generation of cracks due to the segregation are suppressed.

Third Example

In an example 3, a method for making the solder powder with above described composition and the solder ball is described.

Elements are weighed so that the above compositions are formed, and melted at desired temperature in a vacuum melting furnace to make a bulk alloy.

The bulk alloy is processed so as to form solder powder or a solder balls with desired size. A gas-atomizing method, a centrifugal atomizing method, etc. are applicable as a method for forming the solder powder or the solder ball. In these methods, a molten metal in which the bulk metal prepared in advance is melted is solidified to be spherical by using an inert gas, Ar, $N_2$, etc. It is desirable to place a container storing the molten metal in an atmosphere of the inert gas so that the molten metal is not oxidized. It is suitable to use the inert gas except $N_2$ for the alloy composition of the example embodiment. If $N_2$ is used as the inert gas when Mn is added as the additive element, there is a high probability that surface tension of the solder rises due to nitridation of Mn, and a desired size is not obtained. When Mn is added as the additive element, the solder powder and the solder ball can be effectively manufactured if nitridation of Mn is suppressed by using the inert gas, like Ar.

In the example, the strength and elongation of the solder can be improved by using the composition above described. In the example, since the additive element is hard to be deposited in a layer structure near the solder joining interface, a crack which occurs inside the layer structure or on the interface thereof and growth of the crack are prevented, and solder joining with high reliability can be realized.

Fourth Example

A solder paste of an example 4 is used for joining a component electrode and a substrate electrode by a solder. The solder paste of the example is made by mixing and kneading a solder powder, a flux, a solvent, a thixotropic agent, etc. The flux, the solvent, the thixotropic agent which are contained in the solder paste of the example are not restricted.

The solder powder used for the solder paste of the example has the composition described in the example embodiment.

A composition having Ca as an additive element contains 2.0 to 4.0 wt % of Ag, 0.5 to 1.0 wt % of Cu, 0.1 to 0.5 wt % of Ca and a balance of Sn. A more suitable composition contains 2.0 to 4.0 wt % of Ag, 0.5 to 1.0 wt % of Cu, 0.1 to 0.33 wt % of Ca and a balance of Sn.

A composition having Mn as an additive element contains 2.0 to 4.0 wt % of Ag, 0.5 to 1.0 wt % of Cu, 0.1 to 0.5 wt % of Mn and a balance of Sn. A more suitable composition contains 2.0 to 4.0 wt % of Ag, 0.5 to 1.0 wt % of Cu, 0.1 to 0.45 wt % of Mn and a balance of Sn.

If soldering is carried out by using the solder paste of the example, the strength and elongation of the joining portion is improved due to addition of Ca or Mn. As a result, additive element segregation near the interface which is generated when Bi is added and generation of cracks due to the segregation are suppressed.

Fifth Example

A solder joining structure of an example 5 contains an additive element diffused in Sn which is a main component or an additive element which is replaced in a deposited compound phase. A solder used in the solder joining structure of the example embodiment has the solder composition described in the example embodiment.

A composition having Ca as an additive element contains 2.0 to 4.0 wt % of Ag, 0.5 to 1.0 wt % of Cu, 0.1 to 0.5 wt % of Ca and a balance of Sn. A more suitable composition contains 2.0 to 4.0 wt % of Ag, 0.5 to 1.0 wt % of Cu, 0.1 to 0.33 wt % of Ca and a balance of Sn.

A composition having Mn as an additive element contains 2.0 to 4.0 wt % of Ag, 0.5 to 1.0 wt % of Cu, 0.1 to 0.5 wt % of Mn and a balance of Sn. A more suitable composition contains 2.0 to 4.0 wt % of Ag, 0.5 to 1.0 wt % of Cu, 0.1 to 0.45 wt % of Mn and a balance of Sn.

In the solder joining structure of the example, the strength and elongation of the joining portion is improved due to addition of Ca or Mn. As a result, as shown in FIG. 2, a layered or dot-like recrystallized phase of the additive element which appears when Bi is added is not deposited between a solder alloy 10 and an intermetallic compound layer 40 which is formed on a joining interface between the solder and the electrode of the electronic component or the substrate. Therefore the solder joining portion of the example realizes a joining with high reliability.

In the joining portion to which Ca is added as an additive element, an element in a compound layer, like CuSn, NiSn, on the joining interface is replaced with the element and growth of the compound layer is suppressed. The compound layer, like CuSn, NiSn, is hard and fragile, and causes a crack and separation as thickness thereof is increased. Therefore if the growth of the compound layer is suppressed by adding Ca thereto, the solder joining structure with higher reliability and long lifetime can be obtained.

Sixth Example

An electronic component of an example 6 is a BGA (Ball Grid Array) type device employing the solder ball above described.

The solder ball of the electronic component has the solder composition shown in the example embodiment.

A composition having Ca as an additive element contains 2.0 to 4.0 wt % of Ag, 0.5 to 1.0 wt % of Cu, 0.1 to 0.5 wt % of Ca and a balance of Sn. A more suitable composition contains 2.0 to 4.0 wt % of Ag, 0.5 to 1.0 wt % of Cu, 0.1 to 0.33 wt % of Ca and a balance of Sn.

A composition having Mn as an additive element contains 2.0 to 4.0 wt % of Ag, 0.5 to 1.0 wt % of Cu, 0.1 to 0.5 wt % of Mn, and a balance of Sn. A more suitable composition contains 2.0 to 4.0 wt % of Ag, 0.5 to 1.0 wt % of Cu, 0.1 to 0.45 wt % of Mn and a balance of Sn.

Figure 5:
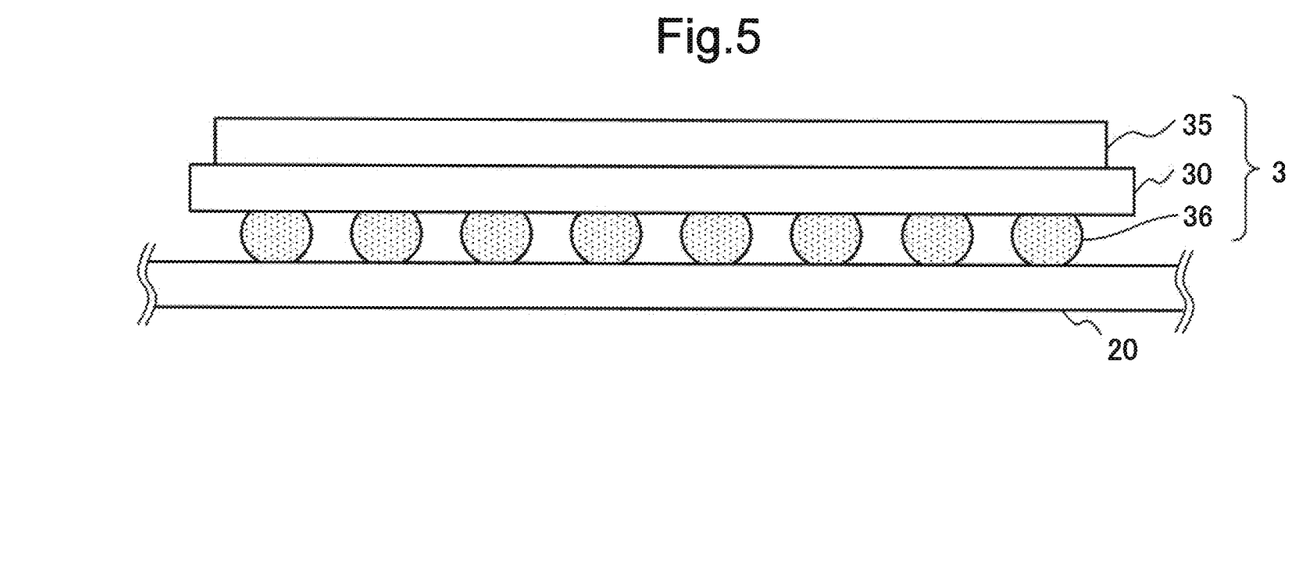
FIG. 5 a schematic diagram illustrating one example in which an electronic component on which a solder ball containing the solder alloy of the example embodiment of the invention is mounted is mounted on a substrate.

FIG. 5 shows an example of an electronic component 3 of the example. The electronic component 3 is a BGA type electronic component having a structure in which a body 35 including an inner structure, like a chip, wiring, faces solder balls 36 mounted on a component electrode electrically joined to the inner structure of the body 35 each other so as to sandwich a component substrate 30. The solder ball 36 has the composition of the solder alloy of the example embodiment.

The electronic component 3 is mounted on the substrate 20 included in an electronic apparatus like a computer, a server. The electronic component 3 may be mounted on a substrate included in an apparatus except the computer or the server.

The electronic component of the example has high reliability when being mounted on a substrate, and has a long lifetime. In the electronic apparatus in which the electronic component of the example is installed, reliability is improved and long lifetime is obtained.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese Patent Application No. 2015-102915, filed on May 20, 2015, the disclosure of which is incorporated herein in its entirety by reference.

REFERENCE SIGNS LIST

10 Solder
20 substrate
21 substrate electrode
22 base material
23 resist
30 electronic component
31 component electrode
32 base material
33 solder mask
40 compound phase

What is claimed is:

1. A solder alloy, comprising: 2.0 to 4.0 wt % of Ag, 0.5 to 1.0 wt % of Cu, 0.1 to 0.5 wt % Ca, and a balance of Sn.

2. The solder alloy according to claim 1, wherein the alloy comprises 2.0 to 4.0 wt % of Ag, 0.5 to 1.0 wt % of Cu, 0.1 to 0.33 wt % of Ca and a balance of Sn.

3. The solder alloy according to claim 1, wherein the alloy comprises 2.0 to 4.0 wt % of Ag, 0.5 to 1.0 wt % of Cu, 0.1 to 0.5 wt % Ca, 0.15 to 0.45 wt % of Mn and a balance of Sn.

4. The solder alloy according to claim 1, wherein the alloy comprises 2.0 to 4.0 wt % of Ag, 0.5 to 1.0 wt % of Cu, 0.1 to 0.33 wt % of Ca, 0.15 to 0.45 wt % of Mn and a balance of Sn.

5. A solder powder, comprising the solder alloy according to claim 1.

6. A solder paste, comprising the solder powder according to claim 5, a flux, a thixotropic agent and solvent that are mixed.

7. A solder joining structure, comprising a structure in which an electrode of an electronic component is joined to an electrode of a substrate on which the electronic component is mounted by using the solder alloy according to claim 1.

8. A solder ball, comprising the solder alloy according to claim 1.

9. An electronic component, comprising the solder ball according to claim 8 mounted on an electrode.

10. An electronic apparatus, comprising a substrate on which the electronic component according to claim 9 is mounted.

* * * * *